United States Patent
Kang

(10) Patent No.: US 11,300,873 B2
(45) Date of Patent: Apr. 12, 2022

(54) OPTICAL PROXIMITY CORRECTION (OPC) METHOD USING A MULTI-OPC MODEL AND METHOD OF MANUFACTURING A MASK BY USING THE OPC METHOD

(71) Applicant: Samsung Electronics Co., Ltd., Suwon-si (KR)

(72) Inventor: Pilsoo Kang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 22 days.

(21) Appl. No.: 16/946,540

(22) Filed: Jun. 26, 2020

(65) Prior Publication Data

US 2021/0116800 A1    Apr. 22, 2021

(30) Foreign Application Priority Data

Oct. 18, 2019    (KR) .................. 10-2019-0130182

(51) Int. Cl.
*G03F 1/36*   (2012.01)
*G03F 1/00*   (2012.01)
*G03F 7/20*   (2006.01)

(52) U.S. Cl.
CPC ............... *G03F 1/36* (2013.01); *G03F 7/705* (2013.01); *G03F 7/70441* (2013.01)

(58) Field of Classification Search
CPC ........ G03F 1/36; G03F 7/705; G03F 7/70441; G03F 1/144
USPC ........................................ 716/50, 51, 53, 54
See application file for complete search history.

(56) References Cited

U.S. PATENT DOCUMENTS

| | | | |
|---|---|---|---|
| 6,171,731 B1* | 1/2001 | Medvedeva et al. | ... G03F 7/705 430/5 |
| 6,263,299 B1* | 7/2001 | Aleshin et al. | ..... G03F 7/70441 382/280 |
| 6,834,262 B1* | 12/2004 | Balasinski et al. | ....... G03F 1/36 703/13 |
| 9,170,501 B2 | 10/2015 | Latypov et al. | |
| 9,280,631 B2 | 3/2016 | Torunoglu et al. | |
| 9,638,994 B2 | 5/2017 | Cheng et al. | |
| 9,740,092 B2 | 8/2017 | Hamouda | |
| 10,922,472 B2* | 2/2021 | Kang et al. | ........... G06F 30/398 |
| 2014/0244226 A1 | 8/2014 | Isoyan et al. | |
| 2019/0004504 A1 | 1/2019 | Yati | |

FOREIGN PATENT DOCUMENTS

| | | |
|---|---|---|
| KR | 1020050077167 | 8/2005 |
| KR | 100798246 | 1/2008 |
| KR | 100944347 | 2/2010 |

* cited by examiner

*Primary Examiner* — Sun J Lin
(74) *Attorney, Agent, or Firm* — Myers Bigel, P.A.

(57) ABSTRACT

The inventive concept provides an optical proximity correction (OPC) method using a multi-OPC model that can reduce a runtime of an entire OPC method by reducing an iteration number of simulations using a complex OPC model, and a method of manufacturing a mask by using the OPC method. The OPC method using the multi-OPC model can generate a re-target pattern to be applied to a simple OPC model, and can perform a simulation by using a complex OPC model on a target pattern after performing a simulation using the simple OPC model on the re-target pattern. Therefore, an iteration number of simulations using the complex OPC model can be reduced and, accordingly, an entire execution time of the OPC method can be reduced.

20 Claims, 11 Drawing Sheets

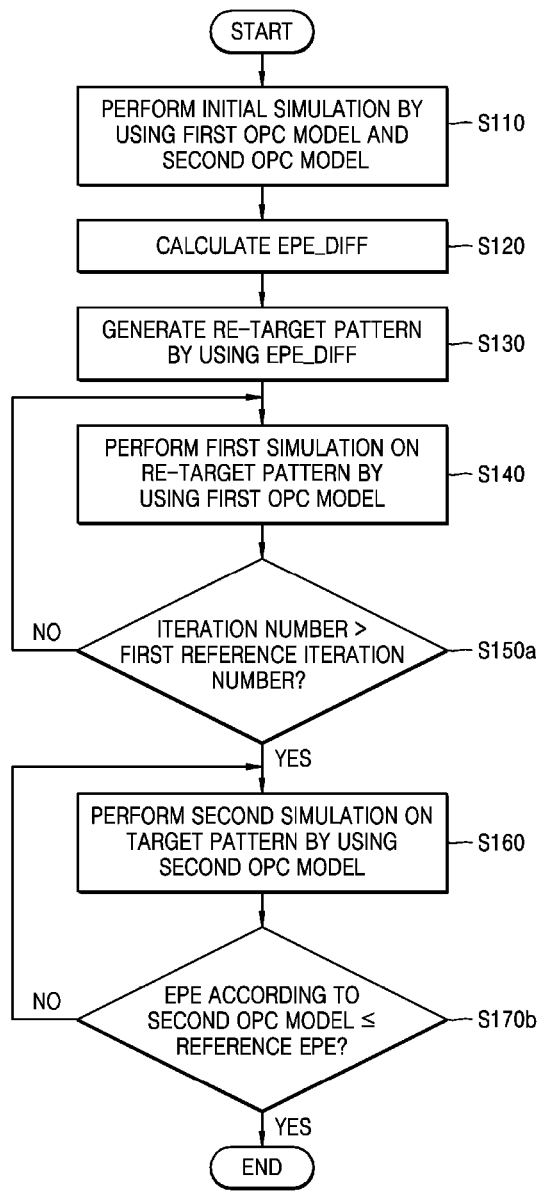

—— Simple OPC Model
—— Complex OPC Model

OPTICAL PROXIMITY CORRECTION (OPC) METHOD USING A MULTI-OPC MODEL AND METHOD OF MANUFACTURING A MASK BY USING THE OPC METHOD

CROSS-REFERENCE TO RELATED APPLICATION

This application claims the benefit of Korean Patent Application No. 10-2019-0130182, filed on Oct. 18, 2019, in the Korean Intellectual Property Office, the disclosure of which is incorporated herein in its entirety by reference.

BACKGROUND

The inventive concept relates to a method of manufacturing a mask, and in particular, to an optical proximity correction (OPC) method and a method of manufacturing a mask by using the OPC method.

In a semiconductor process, a photolithography process using a mask may be performed to form a pattern on a semiconductor substrate, such as a wafer. The mask may be defined as a pattern transfer body in which a pattern shape of an opaque material is formed on a transparent base material. A manufacturing process of the mask may include the following operations: First, a required circuit may be designed and a layout thereof may be designed. Then, design data obtained through optical proximity correction (OPC) may be transferred as mask tape-out (MTO) design data. Thereafter, mask data preparation (MDP) may be performed based on the MTO design data, and a front end of line (FEOL) process, such as an exposure process, and a back end of line (BEOL) process, such as a defect inspection process, may be performed to manufacture the mask.

SUMMARY

Embodiments of the inventive concept may provide an optical proximity correction (OPC) method using a multi-OPC model that may be capable of reducing the runtime of an entire OPC method by reducing an iteration number of simulations using a complex OPC model, and a method of manufacturing a mask by using the OPC method.

According to some embodiments of the inventive concept, there is provided an optical proximity correction (OPC) method, including: performing an initial simulation by using each of a first OPC model and a second OPC model on a target pattern; calculating an edge placement error (EPE) difference (EPE_diff), which is a difference between a first EPE according to the first OPC model and a second EPE according to the second OPC model; generating a re-target pattern by using the EPE_diff; performing a first simulation on the re-target pattern by using the first OPC model; and performing a second simulation on the target pattern by using the second OPC model, wherein the first OPC model has an error tendency of the second OPC model and has a number of kernel functions or a calculation region, which are reduced relative to a number of kernel functions and a calculation region of the second OPC model, respectively.

In other embodiments of the inventive concept, there is provided an optical proximity correction (OPC) method, including: calibrating a first OPC model; performing an initial simulation on a target pattern by using each of the first OPC model and a second OPC model; determining whether a contour by the initial simulation exists; calculating an edge placement error (EPE) difference (EPE_diff), which is a difference between a first EPE according to the first OPC model and a second EPE according to the second OPC model; generating a re-target pattern by using the EPE_diff; performing a first simulation on the re-target pattern by using the first OPC model until a first condition is satisfied; performing a second simulation on the target pattern by using the second OPC model until a second condition is satisfied, wherein the first OPC model has an error tendency of the second OPC model and has a number of kernel functions or a calculation region, which are reduced relative to a number of kernel functions and a calculation region of the second OPC model, respectively.

In further embodiments of the inventive concept, there is provided a method of manufacturing a mask, including: performing an initial simulation by using each of a first optical proximity correction (OPC) model and a second OPC model on a target pattern; calculating an edge placement error (EPE) difference (EPE_diff), which is a difference between a first EPE according to the first OPC model and a second EPE according to the second OPC model; generating a re-target pattern by using the EPE_diff; performing a first simulation on the re-target pattern by using the first OPC model; performing a second simulation on the target pattern by using the second OPC model; obtaining design data of the mask as a result of the second simulation; transferring the design data as mask tape-out (MTO) design data; preparing mask data based on the MTO design data; and performing exposure on a mask substrate based on the mask data, wherein the first OPC model has an error tendency of the second OPC model and has a number of kernel functions or a calculation region, which are reduced relative to a number of kernel functions and a calculation region of the second OPC model, respectively.

BRIEF DESCRIPTION OF THE DRAWINGS

Embodiments of the inventive concept will be more clearly understood from the following detailed description taken in conjunction with the accompanying drawings in which:

FIGS. 1B and 1C are flowcharts illustrating detailed examples of determining whether a first condition is satisfied and determining whether a second condition is satisfied in the OPC method using the multi-OPC model of FIG. 1A;

DETAILED DESCRIPTION OF THE EMBODIMENTS

Figure 1A:
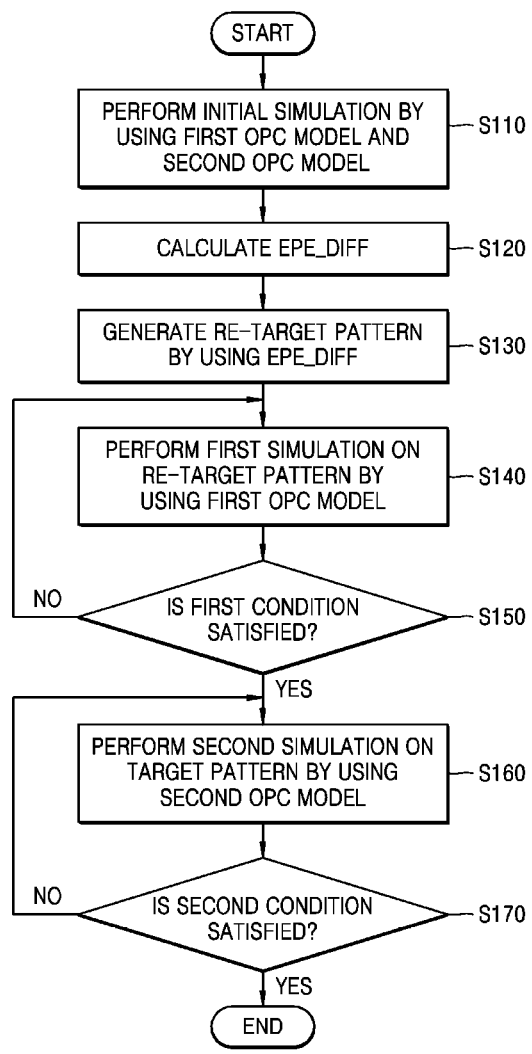
FIG. 1A is a flowchart schematically illustrating a process of an OPC method using a multi-OPC model, according to some embodiments of the inventive concept.

Hereinafter, embodiments of the inventive concept will be described in detail with reference to the accompanying drawings. The same reference numerals of the same reference designators may denote the same elements or components throughout the specification and duplicate descriptions thereof are, therefore, omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 1B:
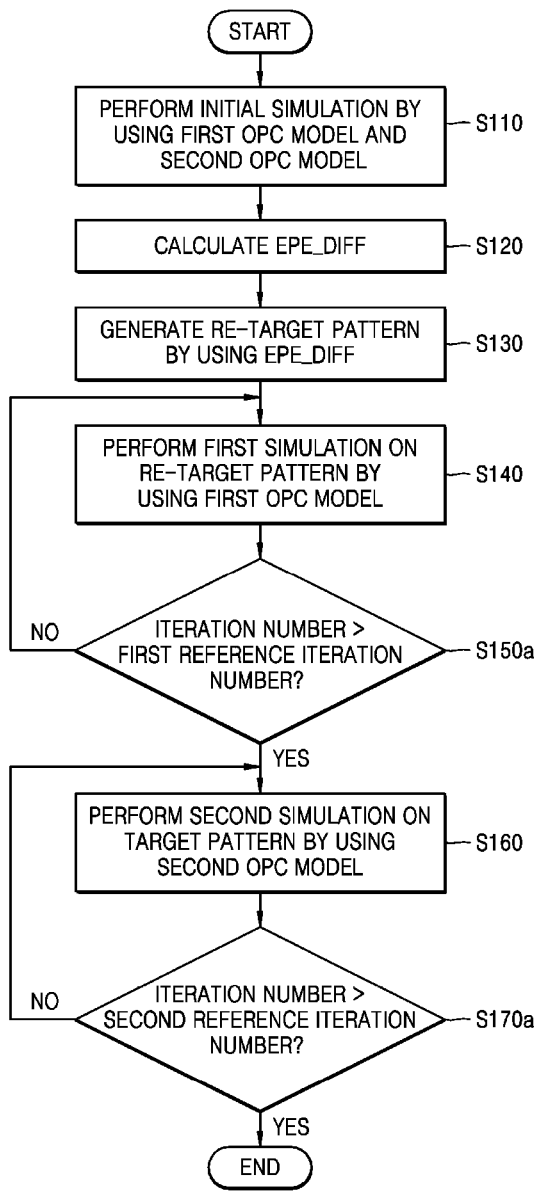
Figure 2A:
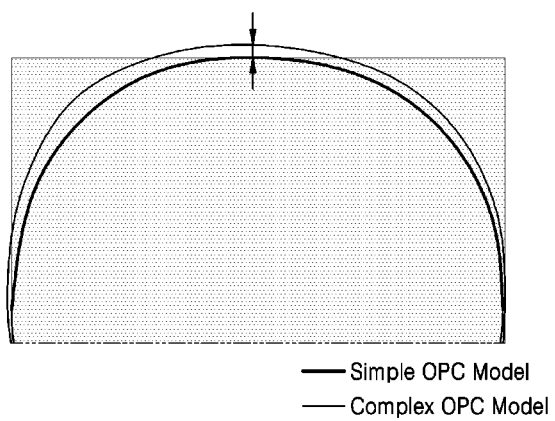
FIG. 2A is a conceptual diagram that illustrates a contour difference between a simple OPC model and a complex OPC model according to some embodiments of the inventive concept.
Figure 2B:
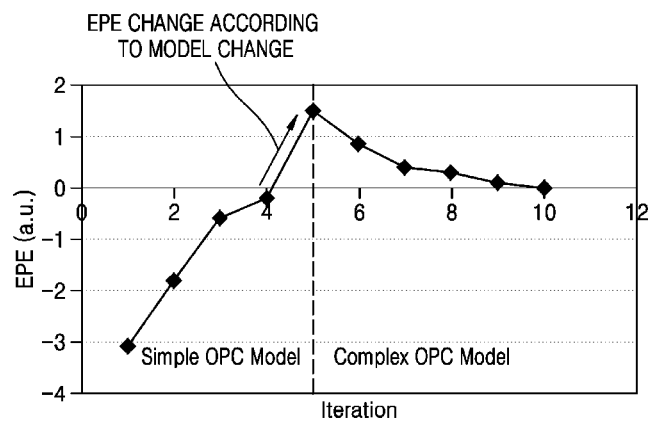
FIG. 2B is a graph that illustrates edge placement errors (EPEs) versus simulation iteration number according to some embodiments of the inventive concept.
Figure 3:
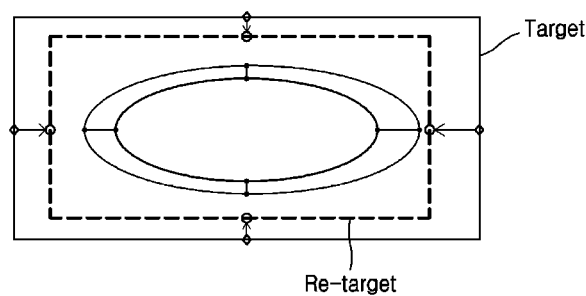
FIG. 3 is a conceptual diagram illustrating an operation of generating a re-target pattern in the OPC method using the multi-OPC model in FIG. 1A.

FIG. 1A is a flowchart schematically illustrating a process of an optical proximity correction (OPC) method using a multi-OPC model according to some embodiments of the inventive concept. FIGS. 1B and 1C are flowcharts illustrating, in the OPC method using the multi-OPC model in FIG. 1A, an operation of determining whether a first condition is satisfied and an operation of determining whether a second condition is satisfied, respectively. FIG. 2A is a conceptual diagram that illustrates a contour difference between a simple OPC model and a complex OPC model according to some embodiments of the inventive concept. FIG. 2B is a graph that illustrates edge placement errors (EPEs) versus simulation iteration number according to some embodiments of the inventive concept. FIG. 3 is a conceptual diagram illustrating an operation of generating a re-target pattern in the OPC method using the multi-OPC model in FIG. 1A.

Referring to FIGS. 1A through 3, the OPC method using the multi-OPC model according to some embodiments of the inventive concept may perform an initial simulation on a target pattern by using a first OPC model and a second OPC model (S110). The target pattern may mean a pattern to be formed on a substrate, and in general, a pattern on a mask may correspond to a pattern formed by being transferred onto the substrate, such as a wafer in an exposure process. In some embodiments, due to characteristics of the exposure process, a shape of the target pattern on the substrate and that of the pattern on the mask may be different from each other. In addition, because the pattern on the mask is reduced, projected, and transferred onto the substrate, the pattern on the mask may have a larger size than the target pattern on the substrate.

A general OPC method may mean a method in which the pattern becomes finer, an optical proximity effect (OPE) due to influence between adjacent patterns is generated during the exposure process. To overcome this issue, the OPE may be suppressed by correcting a layout of the pattern on the mask. The general OPC method may include processes of generating an optical image of a corresponding target pattern, generating the OPC model, obtaining the design data of the mask by using simulation, and the like. In relation to the general OPC method, additional description is provided with respect to operation (S160) of performing a second simulation.

The OPC method using a multi-OPC model (hereinafter, referred to as a 'multi-model OPC method' for convenience) may be an OPC model for simulating the target pattern, and may mean a method in which the first OPC model and the second OPC model are used together. The second OPC model may be referred to as a complex OPC model used in the general OPC method, the first OPC method may be a simple OPC model in which the complex OPC model has been simplified. An error tendency of the first OPC model may be similar to that of the second OPC model.

The complex OPC model used in the general OPC method, that is, the second OPC model, may have many kernel functions used for calculations and a large calculation region. As a result, an excessive runtime may be required for obtaining an OPC result for the target pattern by simulation using the second OPC model. For example, a large iteration number may be required for simulation using the second OPC model. In addition, as recent designs further shrink, more complex phenomena may occur on the wafer, and the second OPC model for simulating the phenomena may become increasingly complex. Thus, an execution time may also be increased.

The simple OPC model, that is, the first OPC model, may be a model in which the second OPC model has been simplified and may mean a model in which the number of kernel functions and the calculation region used for the simulation have been reduced. In addition, the first OPC model may have an error tendency similar to that of the second OPC model. By obtaining an OPC result with respect to the target pattern by the simulation using the first OPC model, a runtime may be reduced. For example, a small iteration number may be required for simulation using the first OPC model. However, the first OPC model is not an accurate OPC model for the target pattern, after the simulation using the first OPC model is performed, by performing the simulation again using the second OPC model, a final OPC result for the target pattern may be obtained.

For reference, when the simple OPC model is calibrated, and the calibration is performed in a direction to reduce an error from measurement data, that is, to reduce an edge placement error (EPE), there may be a high probability that the simple OPC model has an error tendency totally different from the error tendency of an existing complex OPC model when the simple OPC model is calibrated. Here, the EPE may be referred to as a difference between the target pattern and a contour generated by the OPC model, which is calculated at certain EPE evaluation points.

A contour difference between a contour by the simple OPC model and a contour by the complex OPC model may occur as illustrated in FIG. 2A. Accordingly, when a simulation is performed by applying the simple OPC model, and then the simulation is performed by applying the complex OPC model, at a time point where the simple OPC model is changed to the complex OPC model, the EPE by using the simple OPC model and the EPE by using the complex OPC model may be greatly different from each other.

For example, these EPE differences between the simple OPC model and the complex EPE model are illustrated with reference to the graph of FIG. 2B below. In the graph, the x axis may represent the iteration number of the simulation, and the y axis may represent the EPE, which may have arbitrary units. It is assumed that, when a total of ten simulations are performed, the first four simulations are performed using the simple OPC model, and fifth through tenth simulation are performed using the complex OPC model. The four simulations using the simple OPC model may show that the EPE gradually decreases. However, as the simple OPC method is changed to the complex OPC model, it may be seen that the EPE increases significantly in the fifth simulation when using the complex OPC model. These phenomena may be due to calibrating the simple OPC model in a direction of reducing the EPE without taking into account the error tendency of the complex OPC model.

As a result, the complex OPC model may become more complicated, the iteration number for using the complex OPC model may be further required, and accordingly, the execution time may increase. In addition, when an initial correction direction of each segment of the simple OPC model is different from that of the complex OPC model, the EPE may not converge to an appropriate level.

However, the multi-model OPC method, according to some embodiments of the inventive concept, may address the issue described above by calibrating the simple OPC model to have an error tendency similar to that of the second OPC model, or the complex OPC model, in other words, by calibrating the first OPC model by using a normalized cross correlation (NCC). Regarding the calibration of the first OPC model, descriptions of example embodiments are provided in more detail with reference to FIGS. 4 and 5.

Thereafter, a difference EPE_diff between a first EPE according to the first OPC model and a second EPE according to the second OPC model may be calculated (S120). The first EPE may be an EPE corresponding to a difference between the target pattern and a first contour that is obtained by a simulation according to the first OPC model, and a second EPE may be an EPE corresponding to a difference between the target pattern and a second contour that is obtained by a simulation according to the second OPC model.

After the EPE_diff is calculated, a re-target pattern may be generated by using the EPE_diff (S130). A method of generating the re-target pattern, according to some example embodiments, is described below with reference to FIG. 3.

In FIG. 3, an outer rectangle may be the target pattern, an inner ellipse may be the first contour generated using the first OPC model, an outer ellipse may be the second contour generated using the second OPC model, and a small square on each segment of the target pattern may be the EPE evaluation point on the segment. In operation S120 of calculating the EPE_diff, the EPE_diff at the EPE evaluation point may be calculated. In FIG. 3, the EPE_diff is indicated by a line between the first contour and the second contour. Next, the re-target pattern may be generated by providing an offset (refer to arrows) by the calculated EPE_diff to the EPE evaluation point of each segment. In FIG. 3, a dashed rectangle may correspond to the newly generated re-target pattern generated in this manner, and a small circle may correspond to the EPE evaluation point of each segment of the re-target pattern. For reference, in FIG. 3, because the first contour is smaller than the second contour, the re-target pattern may also be smaller than the target pattern. However, sizes of the re-target pattern and the target pattern are not limited thereto. For example, according to some embodiments, the first contour may be larger than the second contour, and in this case, the re-target pattern may be larger than the target pattern. In addition, according to some embodiments, up-down positions and left-right positions of the re-target pattern and the target pattern may be different from each other on each segment.

Next, a first simulation may be performed on the re-target pattern by using the first OPC model (S140). The first simulation by the first OPC model may be a process of obtaining the first contour that approaches the re-target pattern. As described above, by generating the re-target pattern and performing the first simulation using the first OPC model and the re-target pattern, the difference in the EPE that may occur due to a difference between the first OPC model and the second OPC model may be reduced, and in addition, while the iteration number of simulations by using the second OPC model is reduced, an optimum or improved OPC result may be obtained.

In relation to the first simulation, it may be determined whether the first condition is satisfied (S150). As illustrated in FIG. 1B or 1C, the first condition may be whether the iteration number of the first simulation is greater than the iteration number of the first reference. Here, the iteration number of the first reference may be set based on an average iteration number or a maximum iteration number of the first simulation until the EPE, by using the first OPC model, reaches a certain level. However, the first condition is not limited to comparison with the iteration number of the first reference described above. For example, the first condition may be whether, similar to the second condition described below, the EPE by using the first OPC model is equal to or less than a required or desired level of a reference EPE. In some embodiments, the EPE may be calculated at the EPE evaluation point of the re-target pattern.

When the first condition is not satisfied (No), the process may move to the operation of performing the first simulation, and operation S140 of performing the first simulation may be repeated again.

When the first condition is satisfied (Yes), the second simulation may be performed on the target pattern by using the second OPC model (S160). The second simulation by using the second OPC model may be a process of obtaining the second contour that approaches the target pattern. Although not illustrated in the flowchart, a process of returning the re-target pattern to the target pattern may be preceded before the second simulation is performed.

In relation to the second simulation according to the second OPC model, a description of a general OPC method is described below. The OPC method may be divided into two types: a rule-based OPC method and a simulation-based or model-based OPC method. The multi-model OPC method, according to some embodiments, may be included in, for example, the model-based OPC method. The model-based OPC method may be beneficial in terms of time and cost because only measurement results of representative patterns are used without a need of measuring a large number of test patterns.

The OPC method may include not only modification of a layout of the pattern, but also a method of adding sub-lithographic features, which are called serifs, at corners of the pattern, and/or a method of adding sub-resolution assist features (SRAFs), such as scattering bars.

In performing the OPC method, first, basic data for the OPC may be prepared. The basic data may include data on the shape of the patterns of a sample, locations of the patterns, a type of measurement, such as a measurement of a space or line of the pattern, a basic measurement value, etc. In addition, the basic data may include information about thickness, refractive index, dielectric constant, and the like of a photo resist (PR), and may include a source map for a type of an illumination system. However, according to various embodiments, the basic data is not limited to these example data.

After the basic data is prepared, an optical OPC model may be generated. The generation of the optical OPC model may include optimization of a defocus start (DS) position, a best focus (BF) position, and the like in the exposure process. In addition, the generation of the optical OPC model may include generation of an optical image considering a diffraction phenomenon of light, an optical state of the exposure apparatus, etc. However, the generation of the optical OPC model is not limited thereto. For example, the generation of the optical OPC model may include various content related to the optical phenomenon in the exposure process in accordance with various embodiments.

After the optical OPC model is generated, an OPC model for the PR may be generated. The generation of the OPC model for the PR may include optimization of a threshold value of the PR. The threshold value of the PR may denote a threshold value at which a chemical change occurs in the exposure process and may be provided as, for example, intensity of exposure light. The generation of the OPC model for the PR may also include selecting an appropriate model form from various PR model forms.

Both the optical OPC model and the OPC model for the PR may be collectively referred to as OPC models. In the multi-model OPC method according to some embodiments of the inventive concept, the second OPC model may correspond to the optical OPC model. However, according to some embodiments, the second OPC model may mean an OPC model that combines the optical OPC model with the OPC model for the PR. After the OPC model is generated, the simulation may be repeated by using the OPC model. The simulation may be performed until a certain condition is satisfied. For example, a root mean square (RMS) for critical dimension (CD) errors, the EPE, a reference repetition frequency, and the like may be used as iteration conditions of the simulation. By performing the simulation using the OPC model described above, the design data of the mask may be obtained. The design data of the mask obtained by the simulation may be transferred later to a mask production team as mask tape-out (MTO) design data for manufacturing the mask.

Returning to the multi-model OPC method according to some embodiments of the inventive concept, with respect to the second simulation, it may be determined whether the second condition is satisfied (S170). As illustrated in FIG. 1B, the second condition may be whether the iteration number of the second simulation is greater than the iteration number of the second reference. Here, the iteration number of the second reference may be set based on an average iteration number or a maximum iteration number of the second simulation until the EPE according to the second OPC model reaches a certain level. In addition, as illustrated in FIG. 1C, the second condition may be whether the EPE according to the second OPC model is equal to or less than a reference EPE that is a required or desired level. The EPE may be calculated at the EPE evaluation point of the target pattern.

When the second condition is not satisfied (No), the process may continue with the operation of performing the second simulation, and operation S160 of performing the second simulation may be repeated again. When the second condition is satisfied (Yes), the multi-model OPC method may be terminated.

The multi-model OPC method, according to some embodiments of the inventive concept, may generate the re-target pattern to be applied to the first OPC model, which is the simple OPC model, and may reduce an execution time of the entire OPC method by performing a simulation according to the second OPC model, or the complex OPC model, on the target pattern after performing a simulation according to the first OPC model on the re-target pattern and thereby reduce iterations of the simulation according to the second OPC model.

In addition, in the multi-model OPC method according to some embodiments of the inventive concept, when the first OPC model is calibrated, by calculating the NCC between the second OPC model and first OPC model candidates and using a calculated result as a cost function, the first OPC model that has an error tendency similar to that of the second OPC model may be calibrated. Accordingly, issues such as an increase in the difference in the EPE, and an EPE convergence-related problem that may occur at the time when the first OPC model is changed to the second OPC model may be reduced.

Figure 4:
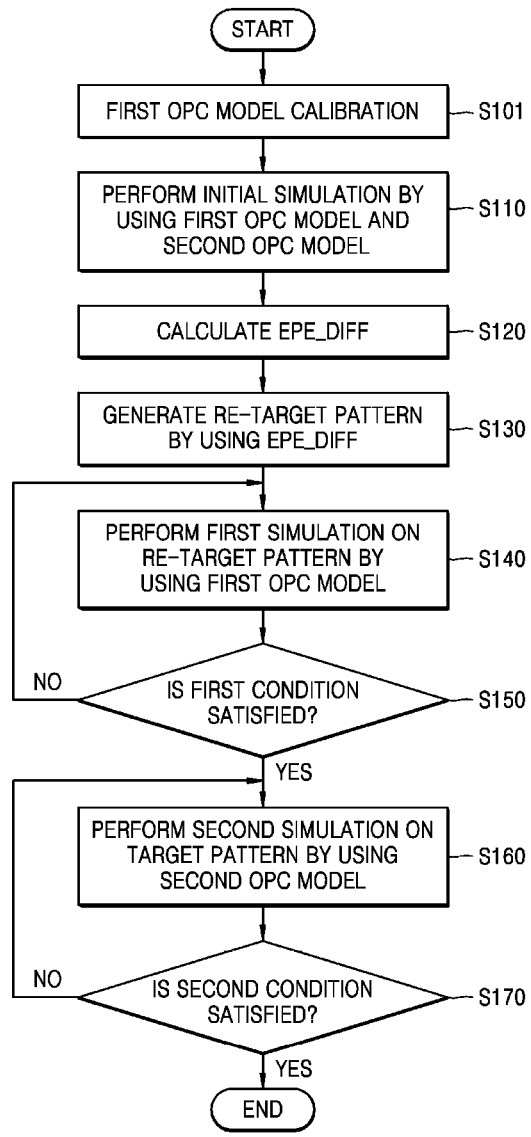
FIG. 4 is a flowchart schematically illustrating a process of an OPC method using a multi-OPC model according to some embodiments of the inventive concept.

FIG. 4 is a flowchart schematically illustrating a process of an OPC method using the multi-OPC model, according to some embodiments of the inventive concept. The descriptions already given with reference to FIGS. 1A through 3 are briefly given or omitted.

Referring to FIG. 4, the multi-model OPC method, according to some embodiments, may be substantially the same as the multi-model OPC method in FIG. 1A, except that the multi-OPC method further includes operation S101 of calibrating the first OPC model. In other words, in the multi-model OPC method according to some embodiments, operations of performing the initial simulation (S110) through determining whether the second condition is satisfied (S170) may be substantially the same as those of the multi-model OPC method in FIG. 1A.

Operation S101 of calibrating the first OPC model may calibrate the first OPC model, which may be the simple OPC model, but may mean a process of calibrating the first OPC model to an optimal first OPC model having a similar error tendency to that of the second OPC model. However, as described above, when the simple OPC model is calibrated only in a direction of minimizing the EPE with respect to the target pattern, there may be a high probability that a simple OPC model has an error tendency completely different from that of the second OPC model when the simple OPC model is calibrated. When the simple OPC model is used, at a time when the simple OPC model is changed to the second OPC model, a large difference in the EPE may occur as compared to when the first OPC model is used, and accordingly, the second OPC model may become more complicated and the execution time may increase. In addition, in severe cases, the EPE may not converge to an appropriate level.

In the multi-model OPC method according to some embodiments of the inventive concept, by calculating the NCC between the second OPC model and the first OPC model candidates and using a calculated result as a cost function, the first OPC model having the error tendency similar to that of the second OPC model may be calibrated, and accordingly, the above-described problems may be addressed. Regarding the calibration of the first OPC model, descriptions are given in more detail with reference to FIGS. 5 and 6.

Figure 5:
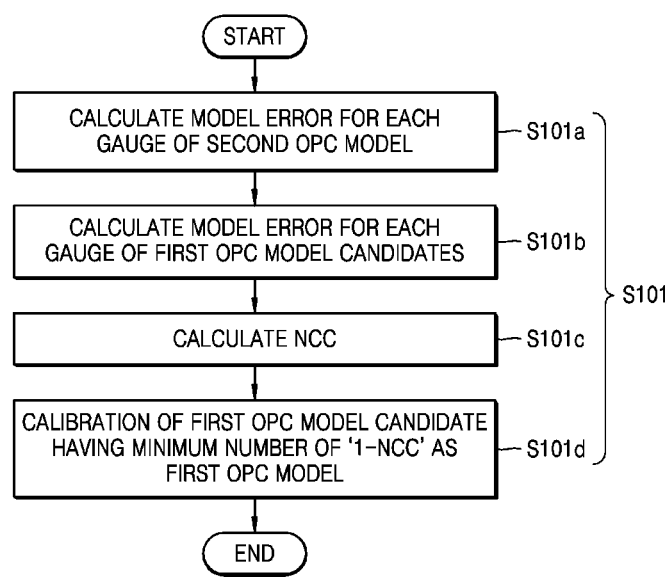
FIG. 5 is a flowchart illustrating operations of calibrating a first OPC model in the OPC method using the multi-OPC model in FIG. 4.
Figure 6:
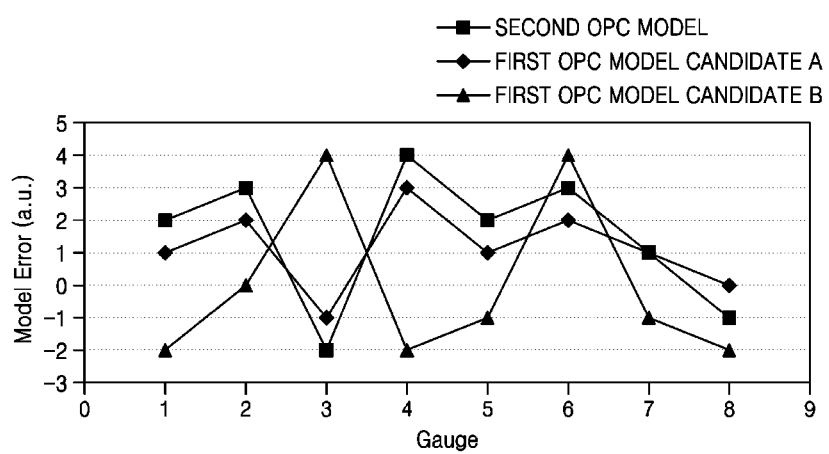
FIG. 6 is a graph illustrating operations of calculating a normalized cross correlation (NCC) in relation to the calibrating of the first OPC model in FIG. 5.

FIG. 5 is a flowchart illustrating the operation of calibrating the first OPC model in the OPC method using the multi-OPC model in FIG. 4. FIG. 6 is a graph illustrating operations of calculating the NCC in relation to the calibration of the first OPC model in FIG. 5.

Referring to FIG. 5, in operation S101 of calibrating the first OPC model, a model error for each gauge of the second OPC model may be calculated (S101a). The gauge may mean a particular pattern used for calibration, and the model error may be a difference between the CD value for a particular pattern on the wafer and the CD value predicted by using the OPC model for the particular pattern. In other words, the model error for each gauge of the second OPC model may mean a difference between the CD value for each pattern on the wafer and the CD value predicted by using the second OPC model for each corresponding pattern.

Next, the model error for each gauge of the first OPC model candidates may be calculated (S101b). In other words, the model error for each gauge of the first OPC model candidates may mean a difference between the CD value for each pattern on the wafer and the CD value predicted by using the first OPC model candidates for each corresponding pattern.

Next, the NCC between the second OPC model and the first OPC model candidates may be calculated (S101c). The NCC may be calculated by using Formula 1 below.

$$NCC(\text{complex, simple}) = \left\{ \sum_{i=0}^{i=n-1} \text{complex}[i] * \text{simple}[i] \right\} \bigg/ \sqrt{\sum_{i=0}^{i=n-1} \text{complex}[i]^2 * \sum_{i=0}^{i=n-1} \text{simple}[n]^2} \quad \text{Formula 1}$$

The NCC may mean a normalized cross correlation between the complex OPC model and the simple OPC model candidate, and may mean that as the NCC becomes closer to about one, similarity between the complex OPC model and the simple OPC model candidate may become high. Complex [i] may mean a model error value for each gauge according to the complex OPC model, and simple[i] may mean a model error value for each gauge according to the simple OPC model candidate.

With reference to FIG. 6, the NCC calculation process is described in detail as follows. In the graph, the x-axis may represent a number corresponding to each gauge, and the y-axis may represent the model error and a unit thereof may be any unit. Intuitively, it may be understood that a first OPC model candidate A is more similar to the second OPC model than a first OPC model candidate B.

When the NCC value is calculated to quantify the similarity, as understood by the following calculation process, the NCC value according to the second OPC model and the first OPC model candidate A may be about 0.976, and the NCC value according to the second OPC model and the first OPC model candidate B may be about −0.193. Accordingly, it may be understood by digitization that the first OPC model candidate A is more similar to the second OPC model than the first OPC model candidate B.

The NCC value (second OPC model, first OPC model candidate A) =

$$\frac{\{1*2 + 2*3 + (-1)*(-2) + 3*4 + 1*2 + 2*3 + 1*1 + 0*(-1)\}}{\{(1+4+1+9+1+4+1+0)* (4+9+4+16+4+9+1+1)\}^{1/2}} = 0.976$$

-continued

The NCC value (second OPC model, first OPC model candidate B) =

$$\frac{\{1*(-2) + 2*0 + (-1)*4 + 3*(-2) + 1*(-1) + 2*4 + 1*(-1) + 0*(-1)\}}{\{(1+4+1+9+1+4+1+0)* (4+0+16+4+1+16+1+4)\}^{1/2}} = -0.193$$

Thereafter, the first OPC model candidate having the minimum cost function may be calibrated as the first OPC model (S101d). Because the calibration of the first OPC model is performed in a direction of minimizing the cost function, for example, a value of '1-NCC' may be used as the cost function. By using the value defined in this manner as the cost function of calibration, an optimal first OPC model having an error tendency similar to that of the second OPC model may be calibrated.

Even though the first OPC model having an error tendency as similar as possible to that of the second OPC model has been calibrated, a difference between the first and second OPC models may still exist. This difference may also appear as an increase in the EPE difference at the time point when a model is changed from the first OPC model to the second OPC model. Accordingly, an additional iteration number of the simulation by using the second OPC model may be required, and in addition, may also affect convergence of the EPE. To address this issue, as described above, the re-target pattern may be generated in the multi-model OPC method according to some embodiments of the inventive concept, and by performing the simulation on the re-target pattern by using the first OPC model, the issue described above may be addressed.

Figure 7:
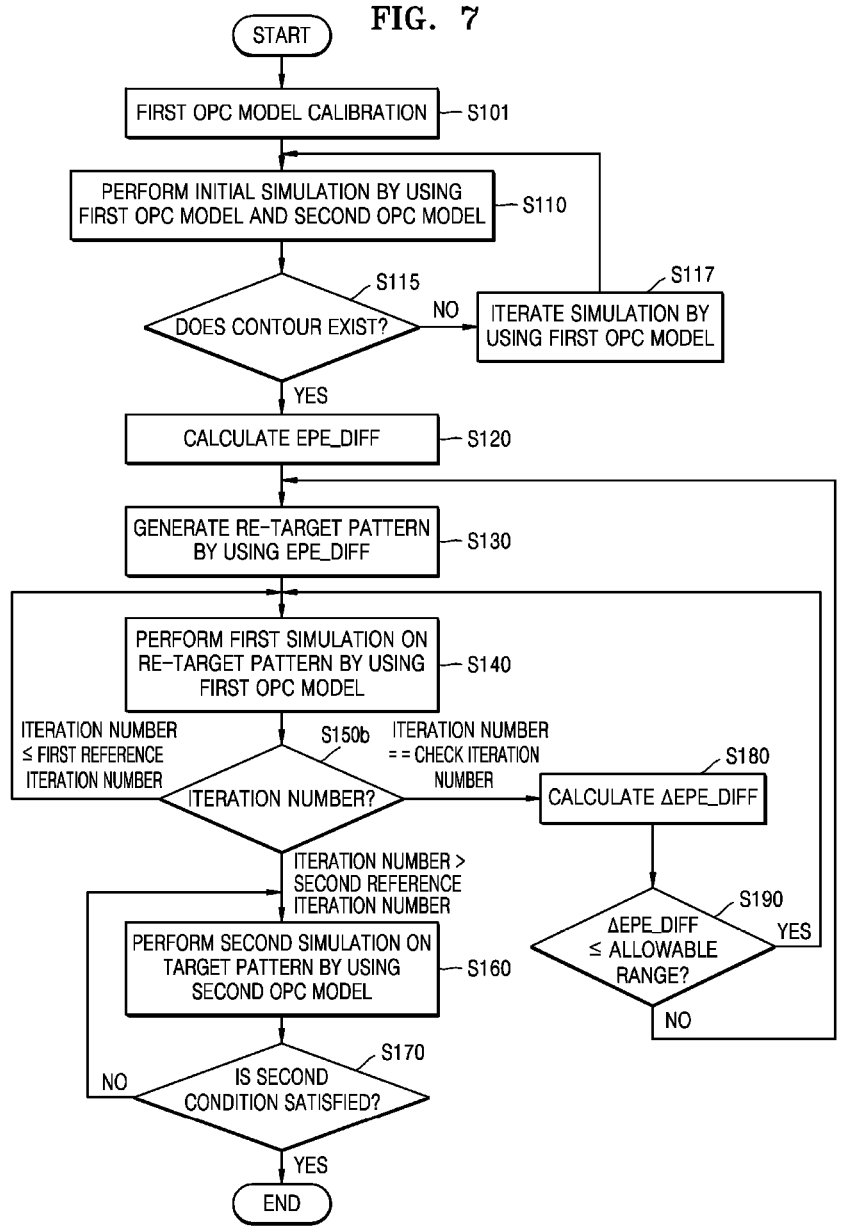
FIG. 7 is a flowchart schematically illustrating a process of an OPC method using a multi-OPC model according to some embodiments of the inventive concept.

FIG. 7 is a flowchart schematically illustrating a process of an OPC method using the multi-OPC model according to some embodiments of the inventive concept.

Figure 8A:
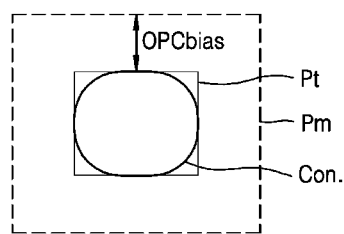
FIG. 8A is a conceptual diagram of a contour obtained by simulation using an OPC model and a target pattern.
Figure 8B:
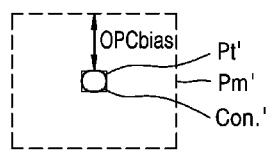
FIG. 8B is a conceptual diagram of a contour obtained by simulation using the OPC model and a relatively small target pattern.

FIG. 8A is a conceptual diagram of a contour obtained by simulation using the OPC model and a target pattern. FIG. 8B is a conceptual diagram of a contour obtained by simulation using the OPC model and a relatively small target pattern. The descriptions already given with reference to FIGS. 1 through 6 are briefly given or omitted.

Referring to FIGS. 7 through 8B, the multi-model OPC method according to some embodiments of the inventive concept may be different from the multi-model OPC method in FIG. 4 from the standpoint that the multi-model OPC method further includes operation S115 of determining whether a contour exists, operation S117 of repeating simulations according to the first OPC model that is additionally required after operation S115, operation S180 of calculating the EPE difference ΔEPE_diff, and operation S190 of determining whether the difference in the EPE ΔEPE_diff is within an allowable range.

First, operation S101 of calibrating the first OPC model and operation S110 of performing an initial simulation may be performed. Operation S101 of calibrating the first OPC model may be the same as operation S101 described with reference to FIG. 5. In addition, operation S110 of performing the initial simulation may be the same as described with reference to FIG. 1a.

Thereafter, whether the contour exists may be determined (S115). In other words, as a result of the initial simulation, whether a contour is obtained by using each of the first OPC model and the second OPC model may be determined. In most cases, the first contour according to the first OPC model and the second contour according to the second OPC model may be obtained by the initial simulation, and accordingly, the EPE difference EPE_diff may be calculated by calculating the first EPE and the second EPE at the EPE evaluation point. However, when a required OPC bias is large and the initial simulation is performed with a particular target pattern as an input, examples where the contour does not come out normally may sometimes occur.

Referring to FIGS. 8A and 8B, as illustrated in FIG. 8A, a contour Con. may be obtained by simulation using the OPC model with a target pattern Pt as an input. In the initial simulation, the contour Con. may deviate much from the target pattern Pt. However, the contour Con. may gradually approach the target pattern Pt by iterating the simulation. In FIG. 8A, a dashed line square on the periphery may correspond to a pattern on a mask Pm that is calculated as the OPC result. In general, an OPC bias OPCbias between the target pattern Pt and the pattern on the mask Pm may be required to have a certain difference. This kind of an OPC bias OPCbias may be generated due to reduced projection in an exposure process.

As illustrated in FIG. 8B, when a target pattern Pt' is relatively small and the simulation by using the OPC model is performed, a contour Con.' may be calculated correspondingly smaller than the target pattern Pt'. However, as described above, in the initial simulation, the contour Con.' may deviate much from the target pattern Pt'. Accordingly, when the simulation according to the OPC model is performed such that the OPC bias is secured, the contour Con.' may not appear or may appear in an unusual shape.

As a result, in the multi-model OPC method according to some embodiments of the inventive concept, in view of the above-described example, operation S115 may further comprise determining whether a contour exists.

When the contour is present (Yes), such as in the multi-model OPC method in FIG. 1A, the process may proceed to operation S120 of calculating the EPE_diff. Otherwise, when the contour does not exist (No), the simulation by using the first OPC model may be performed for a certain number of iterations (S117). Although a contour is not obtained in the initial simulation, as the simulation is iterated, a contour approaching a target pattern may be obtained. In addition, with respect to a calculation time, iteration of the simulation by using the first OPC model rather than the second OPC model may be more advantageous.

Thereafter, operations from calculating the EPE_diff (S120) to determining whether the second condition is satisfied (S170) may be performed. Descriptions of respective operations are the same as descriptions given with reference to FIG. 1A or 4. However, in the multi-model OPC method according to some embodiments of the inventive concept, operation S150 of determining whether the first condition is satisfied in FIG. 1A or 4 may be replaced by operation S150$b$ of determining the iteration number, and three comparisons man be evaluated in operation S150$b$ of determining the iteration number.

In operation S150$b$ of determining the iteration number, when the iteration number of the simulation is greater than the first reference iteration number, the process may proceed to performing the second simulation (S160), and when the iteration number of the simulation is equal to or less than the first reference iteration number, the process may proceed to performing the first simulation (S140). When the iteration number is equal to a set number of check iterations, the process may proceed to operation S180 of calculating a delta EPE difference ΔEPE_diff. The delta EPE difference ΔEPE_diff may mean a difference between the first calculated EPE_diff and the EPE_diff calculated after the number of check iterations, and the number of check iterations may be set to be equal to or less than the first reference iteration number. After the delta EPE difference ΔEPE_diff is calculated, whether the delta EPE difference ΔEPE_diff is within an allowable range may be determined (S190).

An example reason for calculating the delta EPE difference ΔEPE_diff may be as follows: Sometimes, the EPE difference EPE_diff may be large at the beginning and end points of applying the first OPC model. This may be due to the re-target pattern being excessively out of the target pattern. Accordingly, when the re-target pattern is excessively out of the target pattern, it may be required to correct the re-target pattern. In addition, by calculating the delta EPE difference ΔEPE_diff, the allowable range of the re-target pattern may be determined.

When the delta EPE difference ΔEPE_diff is within the allowable range (Yes), the re-target pattern may be determined as still valid and the process may proceed to performing the first simulation (S140). However, when the delta EPE difference ΔEPE_diff is out of the allowable range (No), the re-target pattern may be determined as invalid and the process may proceed to generating the re-target pattern (S120) and the re-target pattern may be generated again.

Figure 9:
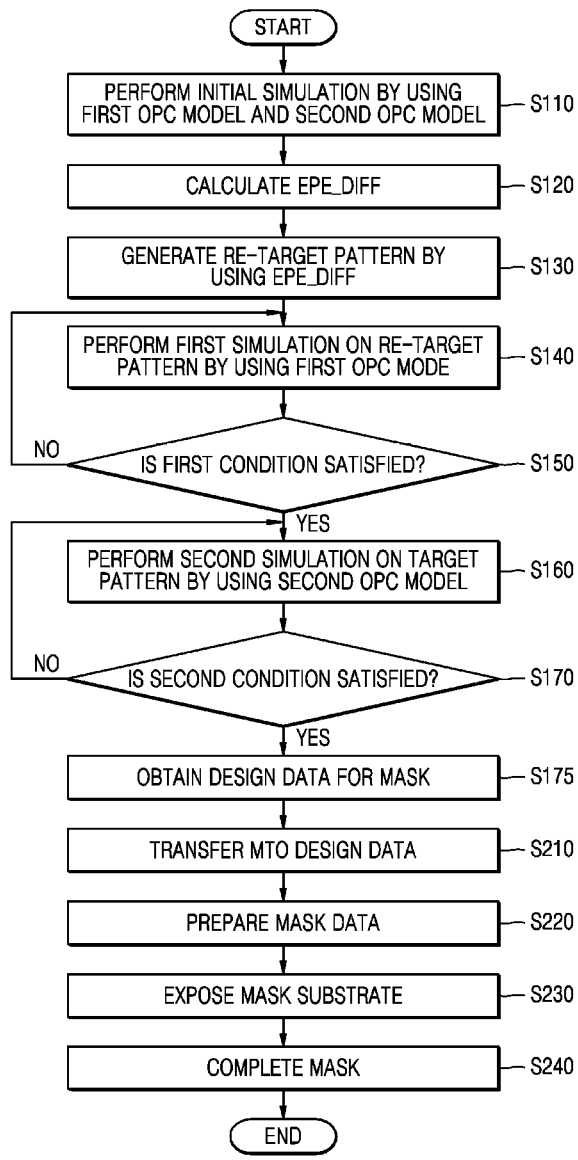
FIG. 9 is a flowchart schematically illustrating a process of a method of manufacturing a mask by using the OPC method according to some embodiments of the inventive concept.

FIG. 9 is a flowchart schematically illustrating a process of a method of manufacturing a mask by using the OPC method, according to some embodiments of the inventive concept.

Referring to FIG. 9, in a method of manufacturing a mask using the OPC method, according to some embodiments of the inventive concept (hereinafter, simply referred to as a 'mask manufacturing method'), operation S110 of performing the initial simulation to operation S170 of determining whether the second condition is satisfied may be performed sequentially. Operation S110 of performing the initial simulation to operation S170 of determining whether the second condition is satisfied may correspond to the multi-model OPC method in FIG. 1A, and respective descriptions of operations are the same as those described with reference to FIG. 1A. The mask manufacturing method according to some embodiments of the inventive concept may not include only the multi-model OPC method in FIG. 1A. For example, the mask manufacturing method according to some embodiments of the inventive concept may include the multi-model OPC method of FIG. 1B, 1C, 4, or 7.

In operation S170 of determining whether the second condition is satisfied, when the second condition is satisfied (Yes), design data for the mask may be obtained (S175). The design data may correspond to a result of performing the simulation by using the second OPC model until the second condition is satisfied.

After the design data is obtained, the design data may be transferred as MTO design data (S210). In general, the MTO may denote a task of transferring the final mask design data obtained through the OPC method to a mask production workflow as a request for manufacturing the mask. Thus, the MTO design data may eventually correspond to the mask data obtained by the OPC method. The MTO design data may have a graphic data format that is used in electronic design automation (FDA) software, etc. For example, the MTO design data may have a data format, such as graphic data system II (GDS2) and open artwork system interchange standard (OASIS).

After the MTO design data is transferred, an operation of mask data preparation (MDP) may be performed (S220). The MDP may include, for example, a format conversion known as fracturing, an augmentation of a bar code for mechanical reading, a standard mask pattern for inspection, and/or a job deck, etc., and an operation of verifying automatic and manual methods. Here, the job deck may denote an operation of creating a text file relating to a series of commands, such as arrangement information about multi-mask files, reference dose, exposure speed and/or method.

The format conversion, that is, the fracturing, may denote a process of dividing the MTO design data into respective regions and changing the MTO design data into a format for an electron beam exposure system. The fracturing may include, for example, data manipulation such as scaling, sizing of data, rotation of data, pattern reflection, and/or color reversal. In a conversion process through the fracturing, data on a number of systematic errors that may occur somewhere in a process of transferring the design data to an image on a wafer may be corrected. The data compensation process for the systematic errors may be referred to as mask process correction (MPC) and may include, for example, a line width adjustment called a CD adjustment and an operation of increasing pattern arrangement accuracy. Thus, the fracturing may be a process, which may contribute to quality improvement of the final mask and, in addition, is performed proactively for an operation of mask process compensation. The systematic errors may be caused by distortions that may occur in one or more of the exposure process, a mask development process, an etching process, a wafer imaging process, etc.

The MDP may include the MPC. The MPC may be referred to, as described above, as a process for correcting an error occurring during the exposure process, that is, a systematic error. The exposure process may be a concept generally including writing, developing, etching, baking, etc. In addition, data processing may be performed ahead of the exposure process. The data processing may be a kind of a preprocessing process for mask data and may include one or more of a grammar checking on the mask data, an exposure time prediction, etc.

After the mask data is prepared, a mask substrate may be exposed based on the mask data (S230). The exposure may denote, for example, electron beam writing. The electron beam writing may be performed by a gray writing method using, for example, a multi-beam mask writer (MBMW). In addition, the electron beam writing may also be performed by using a Variable Shape Beam (VSB) exposure apparatus.

After the MDP is completed, a process of converting the mask data into pixel data may be performed ahead of the exposure process. The pixel data may include data that is directly used for an actual exposure and may include data on a shape of an object to be exposed and data on a dose assigned to each shape. Here, the data on the shape may be bit-map data in which the shape data, which is vector data, has been converted through rasterization, etc.

After the exposure process, a series of processes may be performed to complete the mask (S240). The series of processes may include one or more processes, such as development, etching, and cleaning. In addition, a series of operations for manufacturing a mask may include one or more of a measurement process, a defect inspection, and a defect repair process. In addition, a pellicle application process may be included. Here, the pellicle application process may denote a process of attaching pellicles to a surface of the mask to protect the mask against subsequent contamination during a delivery of the mask and a service life of the mask, when it is verified through the final cleaning and inspection that there are no contamination particles or chemical stains.

In the mask manufacturing method according to some embodiments of the inventive concept, the mask may include a deep ultraviolet (DUV) mask or an extreme ultraviolet (EUV) mask. However, the mask embodiments are not limited to the DUV mask or the EUV mask. For example, the mask in accordance with various embodiments may be a mask for wavelengths other than DUV or EUV.

The mask manufacturing method according to some embodiments of the inventive concept may include the multi-model OPC method. Accordingly, based on the multi-model OPC method, the execution time of the entire OPC method may be reduced, and in addition, issues such as an increase of the EPE difference and a convergence of the EPE may be addressed. As a result, the mask manufacturing method according to some embodiments of the inventive concept may be used to manufacture a reliable mask while reducing the time of the mask manufacturing process.

While the inventive concept has been particularly shown and described with reference to embodiments thereof, it will be understood that various changes in form and details may be made therein without departing from the spirit and scope of the following claims.

What is claimed is:

1. An optical proximity correction (OPC) method, comprising:
    performing an initial simulation by using each one of a first OPC model and a second OPC model on a target pattern;
    calculating an edge placement error (EPE) difference (EPE_diff), which is a difference between a first EPE according to the first OPC model and a second EPE according to the second OPC model;
    generating a re-target pattern by using the EPE_diff;
    performing a first simulation on the re-target pattern by using the first OPC model; and
    performing a second simulation on the target pattern by using the second OPC model,
    wherein the first OPC model has an error tendency of the second OPC model and has a number of kernel functions or a calculation region, which are reduced relative to a number of kernel functions and a calculation region of the second OPC model, respectively.

2. The OPC method of claim 1, further comprising:
    calibrating the first OPC model before the performing of the initial simulation.

3. The OPC method of claim 2, wherein the calibrating of the first OPC model includes calibrating the first OPC model using a normalized cross correlation (NCC) as a cost function to generate a calibrated first OPC model, wherein $NCC(\text{complex, simple}) =$ Formula 1

$$\left\{ \sum_{i=0}^{i=n-1} \text{complex}[i] * \text{simple}[i] \right\} \bigg/ \sqrt{\sum_{i=0}^{i=n-1} \text{complex}[i]^2 * \sum_{i=0}^{i=n-1} \text{simple}[n]^2},$$

wherein the NCC comprises a normalized cross correlation between the second OPC model and the first OPC model, complex[i] is an error value for each gauge according to the second OPC model, and simple[i] is an error value for each gauge according to the first OPC model, wherein the cost function is given by '1-NCC', and wherein the calibrated first OPC model comprises a first OPC model candidate that minimizes the cost function.

4. The OPC method of claim 1, further comprising:
determining whether a contour by the initial simulation exists before calculating the EPE_diff,
wherein the calculating the EPE_diff comprises calculating the EPE_diff when the contour exists, and
wherein the method further comprises:
performing an iterative simulation by using the first OPC model for a defined number of iterations when the contour does not exist; and
re-performing the initial simulation upon completion of the iterative simulation.

5. The OPC method of claim 1, further comprising determining whether a first condition is satisfied before performing the second simulation; and
repeating performing the first simulation or performing the second simulation based on whether the first condition is satisfied.

6. The OPC method of claim 5, wherein the first condition is whether an iteration number of first simulations on the re-target pattern by using the first OPC model is greater than a first reference iteration number,
wherein the repeating performing the first simulation comprises repeating performing the first simulation when the iteration number of the first simulations on the re-target pattern by using the first OPC model is equal to or less than the first reference iteration number, and
wherein the performing the second simulation comprises performing the second simulation when the iteration number of the first simulations on the re-target pattern by using the first OPC model is greater than the first reference iteration number.

7. The OPC method of claim 5, wherein the EPE_diff is a first EPE_diff, the method further comprising:
calculating ΔEPE_diff, which is a difference between the first EPE_diff and an EPE_diff at a check iteration number; and
determining whether the ΔEPE_diff is within an allowable range when the check iteration number is equal to or less than a first reference iteration number and an iteration number of first simulations on the re-target pattern by using the first OPC model is equal to the check iteration number,
wherein the performing the first simulation comprises performing the first simulation when the ΔEPE_diff is within the allowable range, and
wherein the generating the re-target pattern comprises generating the re-target pattern when the ΔEPE_diff is out of the allowable range.

8. The OPC method of claim 1, further comprising determining whether a second condition is satisfied after the performing of the second simulation; and
repeating performing the second simulation when the second condition is not satisfied.

9. The OPC method of claim 8, wherein the second condition is whether an iteration number of second simulations on the target pattern by using the second OPC model is greater than a second reference iteration number, or whether the second EPE according to the second OPC model is equal to or less than a reference EPE.

10. An optical proximity correction (OPC) method, comprising:
calibrating a first OPC model;
performing an initial simulation on a target pattern by using each one of the first OPC model and a second OPC model;
determining whether a contour by the initial simulation exists;
calculating an edge placement error (EPE) difference (EPE_diff), which is a difference between a first EPE according to the first OPC model and a second EPE according to the second OPC model;
generating a re-target pattern by using the EPE_diff;
performing a first simulation on the re-target pattern by using the first OPC model until a first condition is satisfied; and
performing a second simulation on the target pattern by using the second OPC model until a second condition is satisfied;
wherein the first OPC model has an error tendency of the second OPC model and has a number of kernel functions or a calculation region, which are reduced relative to a number of kernel functions and a calculation region of the second OPC model, respectively.

11. The OPC method of claim 10, wherein the calibrating of the first OPC model includes calibrating the first OPC model using a normalized cross correlation (NCC) between the second OPC model and the first OPC model as a cost function.

12. The OPC method of claim 10, wherein the calculating the EPE_diff comprises calculating the EPE_diff when the contour exists, and
wherein the OPC method further comprises:
performing an iterative simulation by using the first OPC model for a defined number of iterations when the contour does not exist; and
re-performing the initial simulation upon completion of the iterative simulation.

13. The OPC method of claim 10, wherein the first condition is satisfied when an iteration number of first simulations on the re-target pattern by using the first OPC model is greater than a first reference iteration number,
wherein the performing the second simulation comprises performing the second simulation when the first condition is satisfied.

14. The OPC method of claim 13, wherein the EPE_diff is a first EPE_diff, the OPC method further comprising:
calculating ΔEPE_diff, which is a difference between the first EPE_diff and an EPE_diff at a check iteration number; and
determining whether the ΔEPE_diff is within an allowable range when the check iteration number is equal to or less than the first reference iteration number and an iteration number of the first simulations on the re-target pattern by using the first OPC model is equal to the check iteration number,
wherein the performing the first simulation comprises performing the first simulation when the ΔEPE_diff is within the allowable range, and
wherein the generating the re-target pattern comprises generating the re-target pattern when the ΔEPE_diff is out of the allowable range.

15. The OPC method of claim 10, wherein the second condition is satisfied when an iteration number of second simulations on the target pattern by using the second OPC model is greater than a second reference iteration number, or when the EPE according to the second OPC model is equal to or less than a reference EPE.

16. A method of manufacturing a mask, the method comprising:
performing an initial simulation by using each one of a first optical proximity correction (OPC) model and a second OPC model on a target pattern;

calculating an edge placement error (EPE) difference (EPE_diff), which is a difference between a first EPE according to the first OPC model and a second EPE according to the second OPC model;
generating a re-target pattern by using the EPE_diff;
performing a first simulation on the re-target pattern by using the first OPC model;
performing a second simulation on the target pattern by using the second OPC model;
obtaining design data of the mask as a result of the second simulation;
transferring the design data as mask tape-out (MTO) design data;
preparing mask data based on the MTO design data; and
performing exposure on a mask substrate based on the mask data,
wherein the first OPC model has an error tendency of the second OPC model and has a number of kernel functions or a calculation region, which are reduced relative to a number of kernel functions and a calculation region of the second OPC model, respectively.

17. The method of claim 16, further comprising:
calibrating the first OPC model before the performing of the initial simulation;
determining whether a contour by the initial simulation exists before the calculating of the EPE_diff;
determining whether a first condition is satisfied before the performing the second simulation; and
determining whether a second condition is satisfied after the performing of the second simulation.

18. The method of claim 17, wherein the calibrating of the first OPC model includes calibrating the first OPC model using a normalized cross correlation (NCC) between the second OPC model and the first OPC model as a cost function,
wherein the calculating the EPE_diff comprises calculating the EPE_diff when the contour exists, and
wherein the method further comprises:
performing an iterative simulation by using the first OPC model for a defined number of iterations when the contour does not exist; and
re-performing the initial simulation upon completion of the iterative simulation.

19. The method of claim 17, wherein the first condition is whether an iteration number of first simulations on the re-target pattern by using the first OPC model is greater than a first reference iteration number, and
wherein the EPE_diff is a first EPE_diff,
the method further comprising:
repeating performing the first simulation or performing the second simulation based on whether the first condition is satisfied;
calculating $\Delta$EPE_diff, which is a difference between the first EPE_diff and an EPE_diff at a set check iteration number when the iteration number of the first simulations is equal to the set check iteration number; and
determining whether $\Delta$EPE_diff is within an allowable range,
wherein the performing the first simulation comprises performing the first simulation when the $\Delta$EPE_diff is within the allowable range, and
wherein the generating the re-target pattern comprises generating the re-target pattern when the $\Delta$EPE_diff is out of the allowable range.

20. The method of claim 17, wherein the second condition is whether an iteration number of second simulations on the target pattern by using the second OPC model is greater than a second reference iteration number, or whether the EPE according to the second OPC model is equal to or less than a reference EPE,
wherein the method further comprises:
repeating performing the second simulation when the second condition is not satisfied.

* * * * *